(12) United States Patent
Saboundji et al.

(10) Patent No.: US 11,473,185 B2
(45) Date of Patent: *Oct. 18, 2022

(54) METHOD FOR THE PROTECTION OF A HAFNIUM-FREE, NICKEL-BASED MONOCRYSTALLINE SUPERALLOY PART AGAINST CORROSION AND OXIDATION

(71) Applicant: SAFRAN, Paris (FR)

(72) Inventors: Amar Saboundji, Moissy-Cramayel (FR); Virginie Jaquet, Moissy-Cramayel (FR)

(73) Assignee: SAFRAN, Paris (FR)

( * ) Notice: Subject to any disclaimer, the term of this patent is extended or adjusted under 35 U.S.C. 154(b) by 338 days.

This patent is subject to a terminal disclaimer.

(21) Appl. No.: 16/308,331

(22) PCT Filed: Jun. 9, 2017

(86) PCT No.: PCT/FR2017/051473
§ 371 (c)(1),
(2) Date: Dec. 7, 2018

(87) PCT Pub. No.: WO2017/212193
PCT Pub. Date: Dec. 14, 2017

(65) Prior Publication Data
US 2019/0194800 A1 Jun. 27, 2019

(30) Foreign Application Priority Data
Jun. 10, 2016 (FR) ........................................ 1655338

(51) Int. Cl.
*C23C 14/16* (2006.01)
*C23C 14/08* (2006.01)
(Continued)

(52) U.S. Cl.
CPC ............ *C23C 14/165* (2013.01); *C23C 12/00* (2013.01); *C23C 14/08* (2013.01); *C23C 14/083* (2013.01);
(Continued)

(58) Field of Classification Search
CPC ....... C23C 14/083; C23C 14/08; C23C 14/14; C23C 14/165; C23C 14/5806;
(Continued)

(56) References Cited

U.S. PATENT DOCUMENTS 5,482,789 A * 1/1996 O'Hara .................. C22C 19/057
428/652
6,296,447 B1 * 10/2001 Rigney .................. C23C 28/325
416/241 R
(Continued)

FOREIGN PATENT DOCUMENTS

EP 0 718 420 A1 6/1996
EP 0 821 078 A1 1/1998
(Continued)

OTHER PUBLICATIONS

International search Report for PCT/FR2017/051473 dated, Nov. 20, 2017 (PCT/ISA/210).
(Continued)

*Primary Examiner* — Michael A Band
(74) *Attorney, Agent, or Firm* — Sughrue Mion, PLLC

(57) ABSTRACT

A process for protecting a part made of a hafnium-free nickel-based single-crystal superalloy against corrosion and oxidation includes manufacturing a part made of a hafnium-free nickel-based single-crystal superalloy, depositing successively on the part, a first layer including hafnium, then a mixed layer of stacked layers of an undercoat of an alloy having 10 atomic % or more of aluminum and a second layer including hafnium or a mixed layer of an alloy of aluminum
(Continued)

Figure 1:
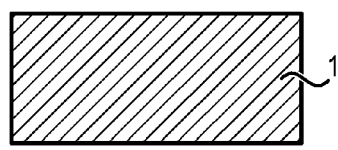

and hafnium, and then a third layer including hafnium, and diffusing and performing an oxidation treatment so as to obtain a hafnium-doped alumina layer.

20 Claims, 2 Drawing Sheets

(51) Int. Cl.
*C23C 14/14* (2006.01)
*C23C 14/34* (2006.01)
*C23C 14/58* (2006.01)
*C23C 12/00* (2006.01)
*C23C 28/00* (2006.01)

(52) U.S. Cl.
CPC .......... *C23C 14/14* (2013.01); *C23C 14/5806* (2013.01); *C23C 14/5853* (2013.01); *C23C 28/321* (2013.01); *C23C 28/345* (2013.01); *C23C 28/3455* (2013.01); *C23C 14/34* (2013.01)

(58) Field of Classification Search
CPC . C23C 14/5853; C23C 28/345; C23C 28/321; C23C 28/3455; C23C 12/10
See application file for complete search history.

(56) References Cited

U.S. PATENT DOCUMENTS

| | | | |
|---|---|---|---|
| 6,585,864 B1* | 7/2003 | Fisher | C23C 26/00 204/192.15 |
| 11,078,567 B2* | 8/2021 | Saboundji | C23C 10/28 |
| 2003/0044633 A1 | 3/2003 | Nagaraj et al. | |
| 2006/0066248 A1* | 3/2006 | Chistyakov | H01J 37/32137 315/111.21 |
| 2019/0153591 A1* | 5/2019 | Saboundji | C23C 10/28 |

FOREIGN PATENT DOCUMENTS

| | | | |
|---|---|---|---|
| EP | 1 010 774 A1 | 6/2000 | |
| EP | 1793012 A2 * | 6/2007 | ............. C23C 14/16 |
| WO | 2012/146864 A1 | 11/2012 | |

OTHER PUBLICATIONS

Preliminary French Search Report for 1655338 dated, Apr. 3, 2017.

* cited by examiner

METHOD FOR THE PROTECTION OF A HAFNIUM-FREE, NICKEL-BASED MONOCRYSTALLINE SUPERALLOY PART AGAINST CORROSION AND OXIDATION

CROSS REFERENCE TO RELATED APPLICATIONS

This application is a National Stage of International Application No. PCT/FR2017/051473 filed Jun. 9, 2017, claiming priority based on French Patent Application No. 1655338, filed Jun. 10, 2016, the disclosures of each of which are incorporated by reference herein in their entireties.

GENERAL TECHNICAL FIELD

The invention is in the field of nickel-based single-crystal superalloys.

More specifically, the present invention relates a process for protecting a hafnium-free nickel-based single-crystal superalloy part against corrosion and oxidation.

STATE OF THE ART

The term "superalloys" refers to complex alloys which, at high temperature and pressure, exhibit very good resistance to oxidation, corrosion, creep and cyclic stresses (notably mechanical or thermal). A particular application of these superalloys is in the manufacture of parts used in aeronautics.

Parts that comprise, successively from the inside to the outside, a nickel-based single-crystal superalloy substrate, an undercoat and a thermal barrier are already known in the state of the art.

The addition of hafnium is known to improve the corrosion and oxidation resistance of superalloys, as well as the adhesion of the thermal barrier.

There are several techniques for adding hafnium to the above-mentioned part.

A first technique consists in adding a small amount of hafnium directly to the substrate, i.e. during the production of the superalloy making up the substrate. However, this makes the solutioning of this superalloy more difficult.

Superalloys undergo heat treatment, including a solutioning phase and tempering phases. Such treatments consist in heating the alloy to an appropriate temperature, below the eutectic temperature, and maintaining this temperature long enough to homogenize the elemental concentrations of its constituents and control the size of the intermetallic precipitates. This optimizes the microstructural properties of the material.

The presence of hafnium in the superalloy, however, makes the complete or almost complete solutioning of the eutectics more difficult and causes burn-type defects.

Moreover, this first technique does not improve the adhesion of the thermal barrier to the substrate, because the amount of hafnium contained in the superalloy is low and the amount of hafnium that diffuses into the undercoat is even lower. However, this first technique improves the oxidation resistance of the part thus obtained.

A second technique consists in adding hafnium to the undercoat while it is being deposited. However, this technique only improves the adhesion of the thermal barrier to the substrate. Indeed, hafnium diffuses mainly into the grain boundaries of the undercoat and, therefore, does not improve the protection of the superalloy substrate against corrosion and oxidation.

Finally, a third known technique consists in adding a small amount of hafnium both to the substrate and during the deposition of the undercoat.

However, this solution has the same problems as those mentioned for the first technique.

PRESENTATION OF THE INVENTION

The objective of the invention is therefore to overcome the above-mentioned disadvantages of the state of the art.

In particular, the objective of the invention is to improve the corrosion and oxidation protection of parts made of a nickel-based single-crystal superalloy that does not contain hafnium.

Furthermore, when the part is coated with a thermal barrier coating, then the invention also has the objective of improving the adhesion of the latter to the part and increasing the service life of the entire part thus formed.

To that end, the invention relates to a process for protecting a hafnium-free nickel-based single-crystal superalloy part against corrosion and oxidation.

In accordance with the invention, this process comprises at least the steps consisting in:
  manufacturing a hafnium-free nickel-based single-crystal superalloy part,
  depositing, on said part, a first layer comprising hafnium, then an undercoat of an alloy comprising at least 10 atomic % aluminium and a second layer comprising hafnium, simultaneously or alternately, so as to form a mixed layer, and finally a third layer comprising hafnium,
  diffusing said first layer comprising hafnium, so as to form a first interdiffusion zone in the upper part of said hafnium-free nickel-based single-crystal superalloy part, and diffusing the third layer comprising hafnium, so as to form a second interdiffusion zone on the surface of said mixed layer,
  after the diffusion treatment, carrying out an oxidation treatment of said second interdiffusion zone, so as to obtain a layer of hafnium-doped alumina on the surface of said second interdiffusion zone.

Thanks to these features of the invention, the part obtained has a better resistance to corrosion and oxidation.

According to other advantageous and non-limiting features of the invention, taken alone or in combination:
  the process consists in first depositing the various layers and undercoat, before proceeding with the diffusion treatment,
  the process comprises at least the following steps consisting in:
    manufacturing a hafnium-free nickel-based single-crystal superalloy part,
    depositing, on said part, a first layer comprising hafnium,
    diffusing this first layer comprising hafnium, so as to form a first interdiffusion zone on the surface of said hafnium-free nickel-based single-crystal superalloy part,
    simultaneously or alternately depositing, on said first interdiffusion zone, an undercoat of an alloy comprising at least 10 atomic % aluminium and a second layer comprising hafnium, so as to form a mixed layer,
    depositing, on said mixed layer, a third layer comprising hafnium, diffusing this third layer comprising hafnium, so as to form a second interdiffusion zone on the surface of said mixed layer, carrying out an oxidation treatment of said second interdiffusion zone, so as to obtain a layer of hafnium-doped alumina on the surface of said second interdiffusion zone, the process comprises a step consisting in depositing a thermal barrier coating, on said layer of hafnium-doped alumina, at least one of the deposition steps is carried out by physical vapour deposition (PVD), preferably by cathode sputtering, the deposition is carried out by cathode sputtering at a temperature comprised between 100° C. and 900° C., under a pressure comprised between 0.1 Pa and 1 Pa, with a power density comprised between 2 and 15 W/cm² and a negative polarization comprised between −150 V and −500 V and under ion bombardment between −200V and 500V for 10 to 30 minutes, the diffusion treatment is carried out by heat treatment under vacuum or in the presence of a mixture of argon and 5% by volume helium, this heat treatment comprising a step of temperature increase until a temperature comprised between 800° C. and 1200° C. is reached, a step of maintaining this temperature for 1 hour to 4 hours and a step of cooling by decreasing the temperature until room temperature is reached, the oxidation treatment of the second interdiffusion zone (41) is carried out by heat treatment under partial pressure of oxygen or argon, this heat treatment comprising a step of temperature increase until a temperature comprised between 900° C. and 1200° C. is reached, a step of maintaining this temperature for less than one hour and a step of cooling until room temperature is reached.

PRESENTATION OF THE FIGURES

Other features and advantages of the invention will become apparent from the description that will now be made, with reference to the appended drawings, which represent, by way of non-limiting illustration, one possible embodiment.

On these drawings:

FIGS. 1 to 8 are diagrams representing the various steps of a first embodiment of the process in accordance with the invention, and FIGS. 9 to 15 are diagrams representing the various steps of a second embodiment of the process in accordance with the invention.

DETAILED DESCRIPTION

The various steps of the process in accordance with the invention will now be described with reference to the figures.

FIG. 1 represents the first step of the process, which consists in manufacturing a hafnium-free nickel-based single-crystal superalloy part 1.

This part 1 is for example obtained by casting or additive manufacturing and has the desired shape.

Table 1 below shows several exemplary superalloys useful in the process in accordance with the invention. They are identified by the letters A to F.

TABLE 1

Exemplary hafnium-free nickel-based single-crystal superalloys

| | Alloy elements (mass percentages) | | | | | | | | | |
|---|---|---|---|---|---|---|---|---|---|---|
| | Ni | Al | Co | Cr | Mo | Re | Ta | Ti | W | Cb | Ru |
| A | Remainder | 5.2 | 6.5 | 7.8 | 2 | 0 | 7.9 | 1.1 | 5.7 | | |
| B | Remainder | 5.6 | 9.6 | 6.5 | 0.6 | 3 | 6.5 | 1 | 6 | | |
| C | Remainder | 5.73 | 9.6 | 3.46 | 0.6 | 4.87 | 8.28 | 0.86 | 5.5 | | |
| D | Remainder | 5.7 | 3 | 2 | 0.4 | 6 | 8 | 0.2 | 5 | 0.1 | |
| E | Remainder | 5.8 | 12.5 | 4.2 | 1.4 | 5.4 | 7.2 | 0 | 6 | | |
| F | Remainder | 6 | <0.2 | 4 | 1 | 4 | 5 | 0.5 | 5 | | 4 |

The term "remainder" corresponds, for each superalloy, to the residual mass percentage to reach 100% with the various other components mentioned.

Figure 2:
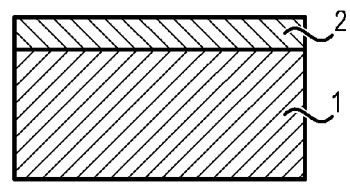
Figure 3:
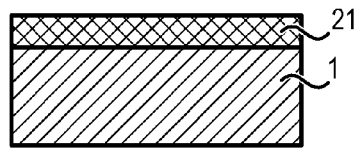

The second step of the process, shown in FIG. 2, consists in depositing, on said part 1, a first layer 2 comprising hafnium. Preferably it has a thickness comprised between 50 nm and 800 nm, more preferably comprised between 50 nm and 300 nm.

Deposition of the first layer of hafnium 2 can be carried out by chemical vapour deposition (CVD).

However, preferably, it is carried out by physical vapour deposition (PVD), more preferably by cathode sputtering, which allows good control of the deposited thicknesses.

PVD is carried out inside an enclosure containing the part 1 and one or more targets corresponding to the material(s) to be deposited, here notably hafnium. Under the application of a potential difference between the reactor walls and the target(s), a plasma is formed whose positive species are attracted to the cathode (target) and collide therewith. The atoms of the target(s) are sputtered and then condense on the part 1.

Preferably, the deposition conditions are as follows:

Heating during deposition: 100° C. to 900° C.
Pressure: 0.1 Pa to 1 Pa,
Power density: 2 to 15 W/cm²,
Polarization: −500 V to −150 V.

Ion bombardment is carried out for 10 to 30 minutes between −200 V and 500 V.

A step of diffusion of this first layer of hafnium 2 is then carried out (see FIG. 3), so as to form, on the surface of said part 1, a first interdiffusion zone 21, in which hafnium is present. Although not shown in these figures, it is possible that the entire layer of hafnium has not diffused and that a thin layer of hafnium remains above the interdiffusion layer 21.

Preferably, the diffusion treatment is carried out by placing the part 1 coated with the first layer of hafnium 2 inside an enclosure, bringing it under vacuum or introducing within it an atmosphere containing a mixture of argon and 5% by volume helium.

This enclosure is preferably different from the one used for deposition but may be the same.

Diffusion is then carried out preferably as described below.

Next is a heat treatment which includes a phase of temperature increase until a temperature comprised between 800° C. and 1200° C. is reached, this temperature stage being maintained for a period of 1 hour to 4 hours.

This stage is then followed by a cooling step which consists in reducing the temperature inside the enclosure until it returns to room temperature.

The first interdiffusion zone 21 thus formed protects the hafnium-free nickel-based single-crystal superalloy part 1 against corrosion and oxidation.

Figure 4:
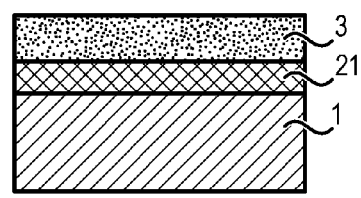

The fourth step of the process, shown in FIG. 4, consists in depositing on the first interdiffusion zone 21, simultaneously or alternately, an undercoat of an alloy comprising at least 10 atomic % aluminium and preferably less than 50 atomic % aluminium, preferably selected from NiAlCrSi, NiAlCrSiPt, NiCoAlCrSiPt, NiAl, NiPtAl or MCrAlY with M equal to cobalt, nickel or cobalt-nickel, and a second layer comprising hafnium, so as to form a mixed layer 3.

Preferably, the undercoat comprising at least 10 atomic % aluminium has a thickness comprised between 5 μm and 30 μm. Also preferably, the second layer comprising hafnium has a thickness comprised between 20 nm and 700 nm.

When the deposition is simultaneous, an alloy is obtained. Thus, for example, if the undercoat is NiAlPt, then the mixed layer 3 obtained will be NiAlPtHf.

This deposition can be carried out by one of the above-mentioned deposition techniques.

Preferably, it is carried out by cathode sputtering under the above conditions.

This simultaneous deposition can be carried out using a hafnium target for the deposition of the layer of hafnium and an alloy target, i.e. containing the various components of the alloy to be deposited, to form the undercoat.

According to another embodiment, this deposition can be carried out using one target per chemical element to be deposited, for example five targets for simultaneous deposition of NiCrAlY and hafnium (co-sputtering deposition).

The table below gives different examples of the undercoat and hafnium thickness pairs that can be used.

TABLE 2

|  | Thicknesses (μm) | | | |
| --- | --- | --- | --- | --- |
| Undercoat | 5 | 10 | 20 | 30 |
| Hafnium | 0.02-0.07 | 0.07-0.1 | 0.1-0.2 | 0.2-0.7 |

The second deposition of hafnium during deposition of the undercoat strengthens the undercoat grain boundaries, by blocking diffusion of the metal cations contained in the undercoat and by slowing the diffusion of oxygen therein and thus slowing the oxidation kinetics of the undercoat. The role of this mixed layer 3 is to increase the lifespan of the aluminium reservoir and the lifespan of the thermal barrier layer if it is formed subsequently.

Figure 5:
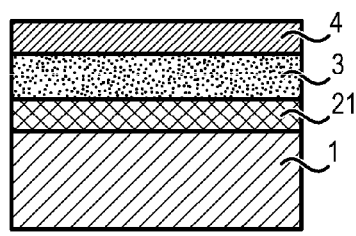

The fifth step of the process, shown in FIG. 5, consists in depositing on said mixed layer 3, a third layer comprising hafnium 4, having a thickness comprised preferably between 10 nm and 100 nm.

Advantageously, this deposition is carried out using the same techniques and under the same conditions as those described above for the deposition of the first layer of hafnium 2.

Figure 6:
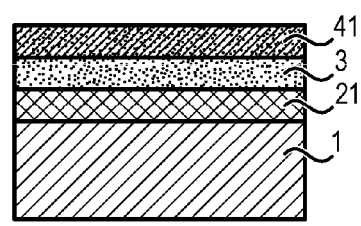

Finally, as shown in FIG. 6, the process consists in subjecting the part 1 to a diffusion treatment then an oxidation treatment.

Diffusion of the third layer of hafnium 4 produces a second interdiffusion zone 41. The diffusion treatment is advantageously carried out under the same conditions as those described above for the diffusion treatment of the first layer of hafnium 2.

Figure 7:
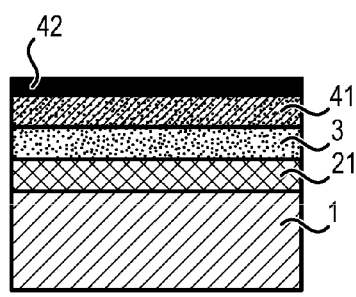

The oxidation treatment, shown in FIG. 7, produces a layer of alumina and hafnium 42.

Its thickness is preferably comprised between 200 nm and 700 nm.

More precisely, it is a layer of alumina comprising hafnium in its grain boundaries, i.e. a layer of alumina doped at its grain boundaries with hafnium.

This oxidation treatment is carried out inside an enclosure under partial pressure of oxygen or argon.

The various steps of the oxidation treatment are preferably as follows:
 temperature increase: preferably 80° C. to 100° C./min,
 oxidation stage: 0.5 h to 1 h, at a temperature comprised between 900° C. and 1200° C.,
 cooling, temperature decrease: preferably 80° C. to 100° C./min.

Figure 8:
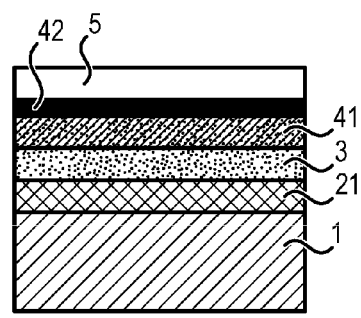

Finally, it is also possible, on the layer of hafnium-doped alumina 42, to proceed with the deposition of a thermal barrier layer 5 (see FIG. 8). This layer 5 is for example yttriated zirconia or a multilayer comprising a ceramic and yttriated zirconia.

It should be noted that the various steps of the deposition of hafnium and diffusion and oxidation undercoat, can be performed in the same deposition machine, which simplifies manufacturing.

A second embodiment of the process in accordance with the invention will now be described in connection with FIGS. 9 to 15. It is a variant of the first embodiment. Consequently, the same layers or undercoats have the same numerical references.

Figure 9:
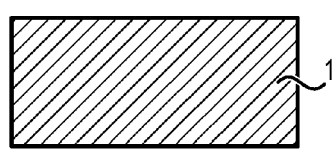
Figure 10:
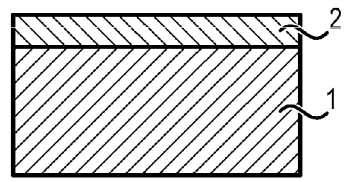

The first two steps of the process shown in FIGS. 9 to 10 are identical to the first two steps of the first embodiment, shown in FIGS. 1 and 2.

Figure 11:
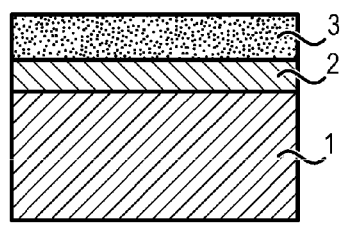

Next is the formation of the mixed layer 3 as described above, but directly on the first layer 2 comprising hafnium (step shown in FIG. 11).

Figure 12:
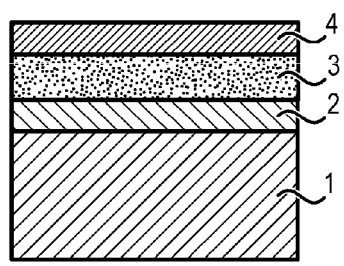

Next is the deposition on said mixed layer 3 of the third layer comprising hafnium 4 as described in the previous embodiment, as shown in FIG. 12.

Figure 13:
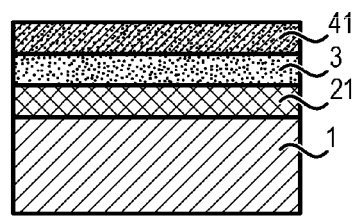

After all of layers 2, 3 and 4 have been formed or deposited, the diffusion treatment is then carried out, so as to diffuse the first layer 2 in the upper part of the part 1 and form there a first interdiffusion zone 21 and so as to diffuse the third layer 4 comprising hafnium on the surface of said mixed layer 3 and form a second interdiffusion zone 41 (see FIG. 13). The diffusion treatment is identical to the one described above in the first embodiment. This step is shown in FIG. 13.

Figure 14:
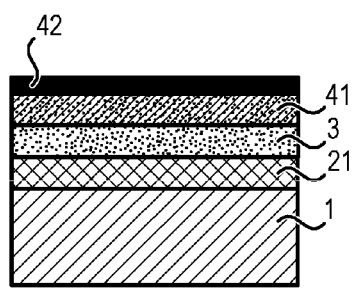
Figure 15:
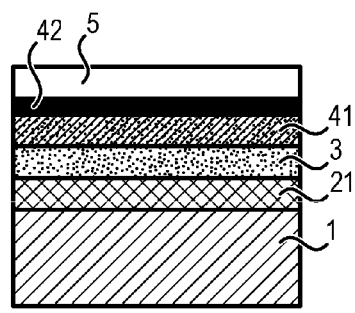

Finally, the last two steps of the process concerning the oxidation treatment of the second interdiffusion zone 41 and optional deposition of the thermal barrier layer 5 on the previously formed alumina layer 42 are then carried out in accordance with what has been described for the steps of the first embodiment. These steps are shown in FIGS. 14 and 15, respectively.

In general, the process in accordance with the invention therefore consists in depositing or forming the various layers 2, 3, 4 and carrying out the above-mentioned diffusion treatment. This diffusion treatment can be either carried out after deposition of the first layer 2 then repeated after deposition of the third layer 4 or carried out in a single step after deposition of all the layers.

The invention claimed is:

1. A process for protecting a hafnium-free nickel-based single-crystal superalloy part against corrosion and oxidation, wherein the process comprises at least:
  a step of manufacturing the hafnium-free nickel-based single-crystal superalloy part;
  a step of depositing a first layer comprising hafnium, directly on said hafnium-free nickel-based single-crystal superalloy part;
  then a step of depositing directly on the first layer comprising hafnium, either alternately an undercoat of an alloy comprising at least 10 atomic % of aluminum and a second layer comprising hafnium so as to form a mixed layer of stacked layers on the first layer comprising hafnium, or simultaneously hafnium and an alloy comprising at least 10 atomic % of aluminium so as to form a mixed layer of alloy on the first layer comprising hafnium; and
  then a step of depositing a third layer comprising hafnium directly on the mixed layer of stacked layers or on the mixed layer of alloy,
  wherein the process comprises after the step of depositing the third layer comprising hafnium, a step of diffusing said first layer comprising hafnium in an upper part of said hafnium-free nickel-based single-crystal superalloy part, so as to form a first interdiffusion zone in the upper part of said hafnium-free nickel-based single-crystal superalloy part, and of diffusing the third layer comprising hafnium on a surface of the mixed layer of stacked layers or on a surface of the mixed layer of alloy, so as to form a second interdiffusion zone on the surface of the mixed layer of stacked layers or on the surface of the mixed layer of alloy,
  and after the step of diffusing, a step of carrying out an oxidation treatment of the second interdiffusion zone, so as to obtain a layer of hafnium-doped alumina on a surface of the second interdiffusion zone,
  wherein at least one of the step of depositing the first layer comprising hafnium, the step of depositing the undercoat of the alloy comprising at least 10 atomic % of aluminum and the second layer comprising hafnium, or the step of depositing the third layer comprising hafnium is carried out by cathode sputtering at a temperature comprised between 100° C. and 900° C., under a pressure comprised between 0.1 Pa and 1 Pa, with a power density comprised between 2 and 15 W/cm$^2$ and a negative polarization comprised between −500 V and −150 V upon the hafnium-free nickel-based single-crystal superalloy part and under ionic bombardment between −200V and 500V for 10 to 30 minutes during the cathode sputtering.

2. A process for protecting a hafnium-free nickel-based single-crystal superalloy part against corrosion and oxidation, wherein the process comprises at least:
  a step of manufacturing the hafnium-free nickel-based single-crystal superalloy part;
  a step of depositing a first layer comprising hafnium, directly on said hafnium-free nickel-based single-crystal superalloy part;
  then a step of diffusing the first layer comprising hafnium in an upper part of said hafnium-free nickel-based single-crystal superalloy part, so as to form a first interdiffusion zone in the upper part of said hafnium-free nickel-based single-crystal superalloy part;
  then a step of depositing, directly on the first interdiffusion zone, either alternately an undercoat of an alloy comprising at least 10 atomic % of aluminum and a second layer comprising hafnium so as to form a mixed layer of stacked layers on the first layer comprising hafnium, or simultaneously hafnium and an alloy comprising at least 10 atomic % of aluminium so as to form a mixed layer of alloy on the first layer comprising hafnium;
  then a step of depositing a third layer comprising hafnium directly on said mixed layer of stacked layers or of alloy,
  then a step of diffusing the third layer comprising hafnium on a surface of the mixed layer of stacked layers or on a surface of the mixed layer of alloy, so as to form a second interdiffusion zone on the surface of the mixed layer of stacked layers or on the surface of the mixed layer of alloy; and
  after the step of diffusing, a step of carrying out an oxidation treatment of the second interdiffusion zone, so as to obtain a layer of hafnium-doped alumina on a surface of the second interdiffusion zone,
  wherein at least one of the step of depositing the first layer comprising hafnium, the step of depositing the undercoat of the alloy comprising at least 10 atomic % of aluminum and the second layer comprising hafnium, or the step of depositing the third layer comprising hafnium is carried out by cathode sputtering at a temperature comprised between 100° C. and 900° C., under a pressure comprised between 0.1 Pa and 1 Pa, with a power density comprised between 2 and 15 W/cm$^2$ and a negative polarization comprised between −500 V and −150 V upon the hafnium-free nickel-based single-crystal superalloy part and under ionic bombardment between −200V and 500V for 10 to 30 minutes during the cathode sputtering.

3. The process according to claim 1, wherein the process comprises a step of depositing a thermal barrier layer on said layer of hafnium-doped alumina.

4. The process according to claim 1, wherein the step of diffusing the first layer comprising hafnium and the third layer comprising hafnium is carried out by heat treatment under vacuum or in a presence of a mixture of argon and 5% by volume helium, by increasing a temperature until reaching between 800° C. and 1200° C., by maintaining the temperature for 1 hour to 4 hours, and after the maintaining of the temperature for 1 hour to 4 hours, decreasing the temperature until room temperature is reached.

5. The process according to claim 1, wherein the step of carrying out the oxidation treatment of the second interdiffusion zone is carried out by heat treatment under partial pressure of oxygen or argon, by increasing a temperature until reaching between 900° C. and 1200° C.

6. The process according to claim 1, wherein the first layer comprising hafnium has a thickness between 50 nm and 800 nm.

7. The process according to claim 1, wherein the undercoat of the alloy comprising at least 10 atomic % of aluminum is selected from NiAlCrSi, NiAlCrSiPt, NiCoAlCrSiPt, NiAl, NiPtAl or MCrAlY with M equal to cobalt, nickel or cobalt-nickel.

8. The process according to claim 1, wherein the undercoat of the alloy comprising at least 10 atomic % of aluminum has a thickness between 5 μm and 30 μm.

9. The process according to claim 1, wherein the second layer comprising hafnium has a thickness between 20 nm and 700 nm.

10. The process according to claim 1, wherein the third layer comprising hafnium has a thickness between 10 nm and 100 nm.

11. The process according to claim 1, wherein the first layer comprising hafnium has a thickness between 50 nm and 300 nm.

12. The process according to claim 2, wherein the process comprises a step of depositing a thermal barrier layer on said layer of hafnium-doped alumina.

13. The process according to claim 3, wherein the step of diffusing the first layer comprising hafnium and the third layer comprising hafnium is carried out by heat treatment under vacuum or in the presence of a mixture of argon and 5% by volume helium, by increasing a temperature until reaching between 800° C. and 1200° C., by maintaining the temperature for 1 hour to 4 hours, and after the maintaining of the temperature for 1 hour to 4 hours, decreasing the temperature until room temperature is reached.

14. The process according to claim 3, wherein the step of carrying out the oxidation treatment of the second interdiffusion zone is carried out by heat treatment under partial pressure of oxygen or argon, by increasing a temperature until reaching between 900° C. and 1200° C.

15. The process according to claim 2, wherein the first layer comprising hafnium has a thickness between 50 nm and 800 nm.

16. The process according to claim 2, wherein the undercoat of the alloy comprising at least 10 atomic % of aluminum is selected from NiAlCrSi, NiAlCrSiPt, NiCoAlCrSiPt, NiAl, NiPtAl or MCrAlY with M equal to cobalt, nickel or cobalt-nickel.

17. The process according to claim 2, wherein the undercoat of the alloy comprising at least 10 atomic % of aluminum has a thickness between 5 μm and 30 μm.

18. The process according to claim 2, wherein the second layer comprising hafnium has a thickness between 20 nm and 700 nm.

19. The process according to claim 2, wherein the third layer comprising hafnium has a thickness between 10 nm and 100 nm.

20. The process according to claim 2, wherein the first layer comprising hafnium has a thickness between 50 nm and 300 nm.

* * * * *